(12) United States Patent
Hendrickson

(10) Patent No.: US 6,443,435 B1
(45) Date of Patent: Sep. 3, 2002

(54) VAPORIZATION OF PRECURSORS AT POINT OF USE

(75) Inventor: Scott Hendrickson, Brent Wood, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/695,488

(22) Filed: Oct. 23, 2000

(51) Int. Cl.[7] .................................................. B01F 3/04
(52) U.S. Cl. ...................... 261/128; 261/131; 261/72.1; 261/DIG. 65
(58) Field of Search ........................... 261/35, 42, 72.1, 261/142, 128, 131, 141, DIG. 65

(56) References Cited

U.S. PATENT DOCUMENTS

| | | | |
|---|---|---|---|
| 3,583,685 A | * | 6/1971 | Boerger et al. ............. 261/128 |
| 4,276,243 A | * | 6/1981 | Partus ........................ 261/128 |
| 4,950,621 A | | 8/1990 | Irvine et al. ................. 437/81 |
| 5,000,113 A | | 3/1991 | Wang et al. ................ 118/723 |
| 5,204,314 A | | 4/1993 | Kirlin et al. .................... 505/1 |
| 5,262,356 A | | 11/1993 | Fujii ........................... 437/225 |
| 5,372,754 A | | 12/1994 | Ono ............................ 261/142 |
| 5,419,924 A | * | 5/1995 | Nagashima et al. . 261/DIG. 65 |
| 5,531,183 A | | 7/1996 | Sivaramakrishnam et al. ... 117/93 |
| 5,681,613 A | | 10/1997 | Hansen ..................... 427/248.1 |
| 5,733,375 A | * | 3/1998 | Fukuda et al. .............. 261/131 |
| 6,135,433 A | * | 10/2000 | Nurmi ........................ 261/128 |
| 6,287,990 B1 | * | 9/2001 | Cheung et al. ............. 438/780 |

OTHER PUBLICATIONS

Dow Corning, "Information About Dow Corning® 9–5170 Trimethylsilane (3MS) Semiconductor Grade," 4 pages.
Tannenbaum, Kaye, and Lewenz, "Synthesis and Properties of Some Alkylsilanes," Aug. 5, 1953, vol. 75 pp. 3753–3757, 5 pages.
Dow Corning Corporation "Material Safety Data Sheet for Dow Corning ® 9–5170 Trimethylsilane (3MS) Semiconductor Grade," 11 pages.

* cited by examiner

Primary Examiner—C. Scott Bushey
(74) Attorney, Agent, or Firm—Moser, Patterson & Sheridan

(57) ABSTRACT

An apparatus and method for vaporizing and delivering liquid precursors to a processing chamber is provided. In one aspect, the apparatus is a liquid delivery system including a liquid supply, a vaporization assembly fluidicly coupled to the liquid supply, the vaporization assembly consisting essentially of an ampoule and a mass flow controller connected to the ampoule, and a processing chamber fluidicly coupled to the vaporization assembly. The liquid precursor is vaporized in the ampoule. In a preferred embodiment, the ampoule is located adjacent the processing chamber to provide point of use vaporization of the liquid precursor. In another aspect, the method includes providing a liquid supply containing a liquid precursor, delivering the precursor to an ampoule, vaporizing a portion of the liquid precursor in the ampoule, and flowing vaporized precursor to a processing chamber.

29 Claims, 3 Drawing Sheets

VAPORIZATION OF PRECURSORS AT POINT OF USE

BACKGROUND OF THE INVENTION

1. Field of the Invention

The present invention relates to semiconductor substrate processing equipment and an apparatus for vaporization and delivery of chemical precursors.

2. Background of the Related Art

Reliably producing sub-half micron and smaller features is one of the key technologies for the next generation of very large scale integration (VLSI) and ultra large scale integration (ULSI) semiconductor devices. However, the shrinking dimensions of interconnects in VLSI and ULSI technology has placed additional demands on processing capabilities. The multilevel interconnect features that lie at the heart of this technology require careful processing of high aspect ratio features, such as vias, lines, contacts, and other interconnects. Reliable formation of these interconnect features is very important to the VLSI and ULSI success and to the continued effort to increase circuit density and quality of individual substrates and die.

As circuit densities increase, the widths of vias, contacts and other features, as well as the dielectric materials between them, decrease to sub-micron dimensions, i.e., 0.5 $\mu$m or less, whereas the thickness of the dielectric layers remains substantially constant, with the result that the aspect ratios for the features, i.e., their height divided by width, increases. Many traditional deposition processes have difficulty filling sub-micron structures where the aspect ratio exceed 2:1, and particularly where it exceeds 4:1 or 10:1. Therefore, there is a great amount of ongoing effort being directed at the formation of submicron features having high aspect ratios.

In particular, in order to further reduce the size of devices on integrated circuits, it has become necessary to use conductor materials having low resistivity and materials having low dielectric constants, k, of less than 4.0 to reduce the capacity coupling between adjacent metal lines. For example, one material used to deposit low dielectric constant films is trimethylsilane (TMS). Trimethylsilane is typically deposited by a chemical vapor deposition (CVD) technique or plasma enhanced chemical vapor deposition technique (PECVD) in a processing chamber.

An example of a plasma enhanced deposition of trimethylsilane is described in U.S. Pat. No. 6,287,990, entitled "CVD Plasma Assisted Low Dielectric Constant Films," issued Sep. 11, 2001, and incorporated by reference herein. In a chemical vapor deposition process, trimethylsilane is typically introduced into a processing chamber as a gaseous fluid.

FIG. 1 is a schematic view of one embodiment of a conventional delivery system 10 for delivering precursors, such as trimethylsilane, to a processing chamber 80. The conventional delivery system 10 generally comprises a source of precursor, such as a precursor ampoule 20, operatively coupled (i.e., coupled either directly or indirectly) to a mass flow controller 40, and a processing chamber 80.

Generally, the precursor leaves the precursor ampoule 20 in a gaseous state, and is delivered to the processing chamber 80 via a mass flow controller 40. The precursor moves through the components of delivery system 10 via flow path 25 from the precursor ampoule 20 to the processing chamber 80. The flow path 25 conventionally has an extension into the top portion of the precursor ampoule to minimize liquids from entering the flow path 25. The precursor ampoule 20, the mass flow controller 40, and the processing chamber 80 may be located a substantial distance apart from each other along the flow path 25. Break 90 indicates an abbreviated distance between the precursor ampoule 20 and mass flow controller 40, and the processing chamber 80. The distance between the precursor ampoule 20 and the processing chamber 80 can be 450 feet or more in length.

However, precursors, such as trimethylsilane, in a gaseous or vaporized state may condense or decompose in the lines between the precursor ampoule 20 and the processing chamber 90, and thereby produce an inconsistent precursor flow rate, form a particle problem in the system, or interfere with the deposition of the material in the processing chamber. One solution to prevent condensation and control degradation of the liquid precursors is to heat the lines from the precursor ampoule 20 to the processing chamber 80, such as by a heat trace or by a heating tape, to a temperature above the precursor's condensation temperature but below the precursor's degradation temperature. However, heating of the lines, which can reach lengths of 450 feet or more, requires significant installation and operation expense, increased production costs, and increased overall maintenance of the system.

Furthermore, the precursor material, such as trimethylsilane, used in chemical vapor deposition processes are often flammable in a vapor or vaporized state, and require special equipment and procedures for safe handling of the compounds. The additional equipment and procedures also contribute to increased production costs and increased maintenance of the system.

Therefore, it remains a need for a method and apparatus for delivering a vaporized liquid precursor to a processing chamber in a substrate processing system.

SUMMARY OF THE INVENTION

The invention generally provides a method and apparatus for vaporizing and delivering liquid precursors to a processing chamber. In one aspect, the invention provides a liquid delivery system, including a liquid supply, a vaporization assembly fluidicly coupled to the liquid supply, the vaporization assembly consisting essentially of an ampoule and a mass flow controller connected to the ampoule, and a processing chamber fluidicly coupled to the vaporization assembly. The liquid precursor is vaporized in the ampoule. In a preferred embodiment, the ampoule is located adjacent the processing chamber to provide point of use vaporization of the liquid precursor.

In another aspect, the invention provides a method for vaporizing a liquid precursor for delivery to a processing chamber, comprising providing a liquid supply containing a liquid precursor, delivering the liquid precursor to an ampoule, vaporizing a portion of the liquid precursor in the ampoule, and flowing vaporized precursor to a processing chamber.

In another aspect, the invention provides a method for vaporizing a liquid precursor for delivery to a processing chamber, comprising providing a liquid supply containing a liquid precursor, heating the liquid supply to a first temperature to provide a first pressure, operating an ampoule at a second pressure lower than the first pressure, flowing the liquid precursor from the liquid supply to the ampoule, vaporizing a portion of the liquid precursor in the ampoule, and flowing vaporized precursor to a processing chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides an apparatus for vaporizing a precursor in a delivery system. The invention will be described below in reference to a liquid delivery system for a chemical vapor deposition (CVD) process that can be carried out using process equipment, such as an Endura® or Centura® platforms, available from Applied Materials, Inc., located in Santa Clara, Calif. The equipment preferably includes an integrated platform having a CVD chamber, such as a DxZ™ plasma enhanced CVD (PECVD) chamber commercially available from Applied Materials, Inc., of Santa Clara, Calif. While the following description is directed to a liquid delivery system having a CVD process chamber, the invention described herein is equal applicable to all types of liquid delivery system that vaporize and deliver liquid precursors.

Figure 1:
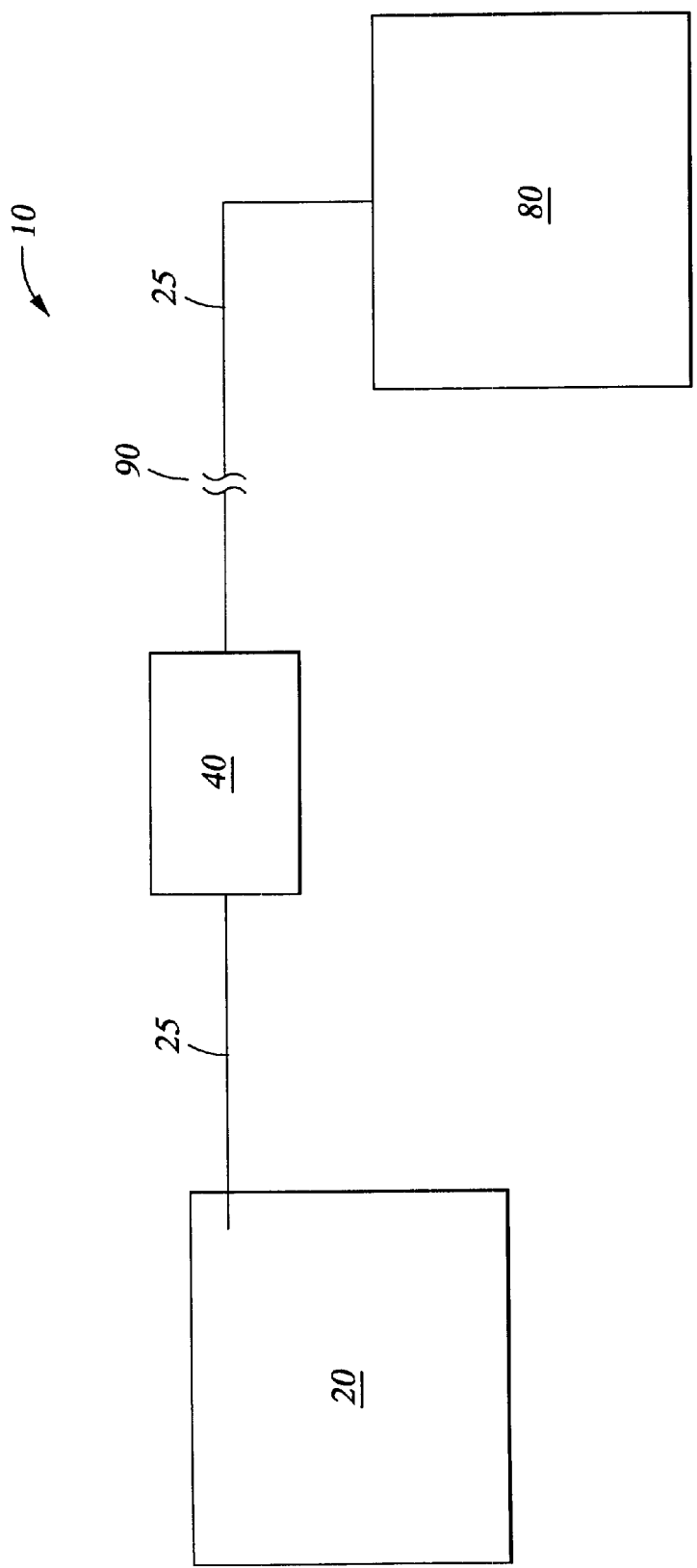
FIG. 1 is schematic view of a prior art liquid delivery system.
Figure 2:
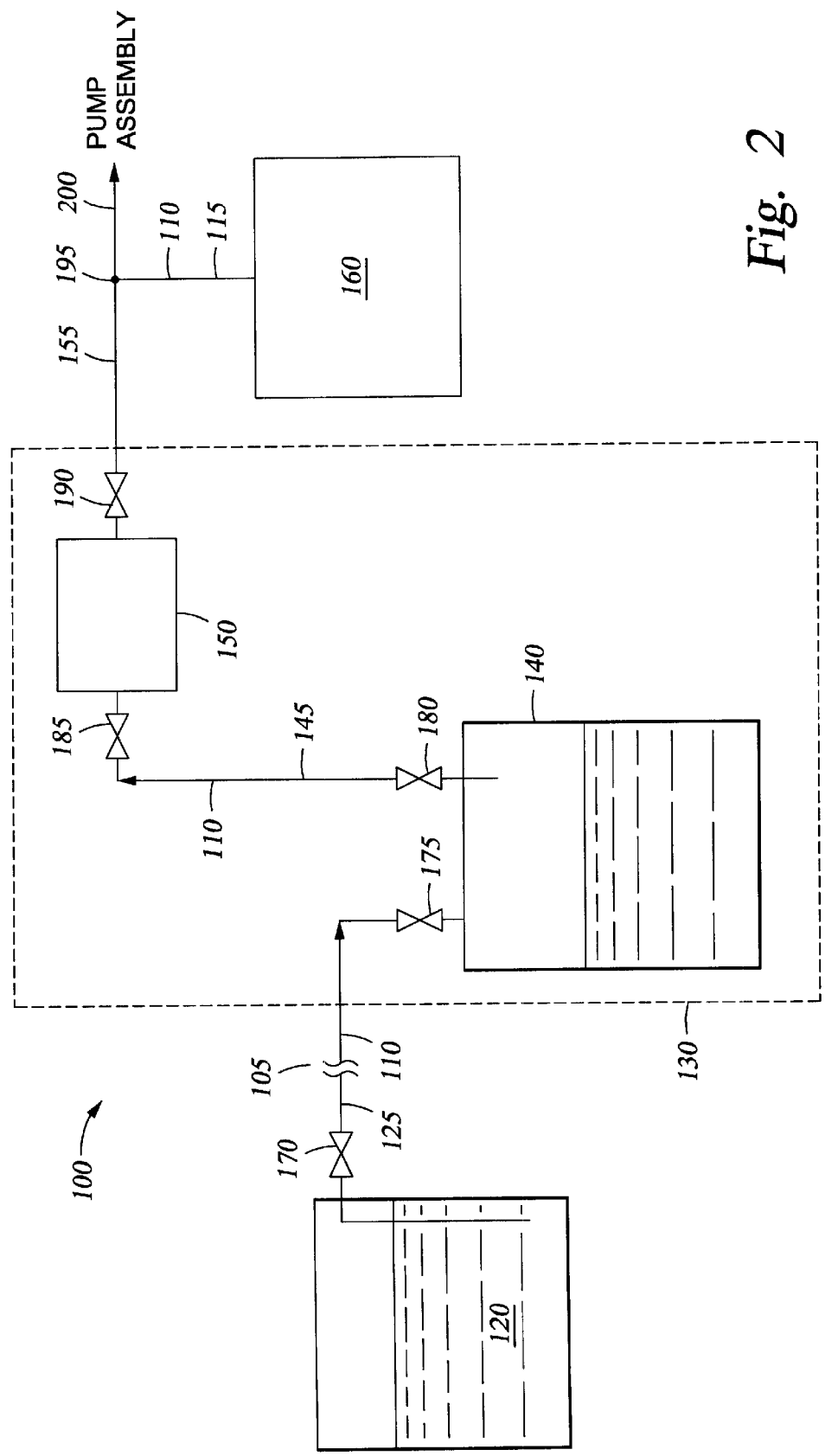
FIG. 2 is a schematic view of one embodiment of a liquid delivery system for vaporizing and delivering a liquid precursor to a processing chamber.

FIG. 2 is a schematic view of one embodiment of a liquid delivery system 100. The liquid delivery system 100 comprises an internal gas pressuring system to transfer precursor material therein. The liquid delivery system 100 generally provides a liquid precursor to a vaporizer, vaporizes the liquid precursor, and then delivers the vaporized precursor to a processing chamber which dissociates or reacts the vaporized precursor to deposit a film of a substrate surface. The liquid delivery system 100 generally includes a source of liquid precursor 120, a vaporization assembly 130, and a processing chamber 160 along a flow path 110. The vaporization assembly 130 includes an ampoule 140 and a mass flow controller 150, and is typically disposed in a gas box (not shown) located adjacent the processing chamber 160.

The flow path 110 includes a fluid line 125 disposed between the liquid supply 120 and ampoule 140, a fluid line 145 disposed between the ampoule 140 and the mass flow controller 150, fluid lines 155 and 115 disposed between the mass flow controller 150 and the processing chamber 160, and a fluid line 200 located between the mass flow controller 150 and a pump assembly (not shown). Fluid lines 125, 145, 155, 115, and 200 are preferably double contained lines suitable for transferring liquids.

A plurality of isolation valves are disposed along the flow path 110 to regulate the flow of precursor through the system 100. The isolation valves also separate the various components of the liquid delivery system 110 allowing for component replacement and maintenance of the liquid delivery system, and replacement of components.

The source of liquid precursor, or the liquid supply 120 comprises a container, typically a 35 lb., 50 lb., or bulk canister, provided by the manufacturer containing the liquid precursor to be vaporized in processing system. Such a liquid supply of a liquid precursor can be obtained from ATMI, Inc., of Danbury, Conn. Other suppliers can include Air Products, Inc, of Allentown, Pa., and Voltaic of North Brook, N.J.

The liquid supply 120 is heated to pressurize the material con the liquid material is then forced into and along the flow path 110. The flow path 110 typically includes an extension into the bottom portion of the liquid supply to minimize gaseous precursor from entering the flow path 100.

The liquid supply 120 is typically heated by a heating element, such as a water jacket, disposed on or adjacent the liquid supply. Other methods of heating the liquid supply 120, such as heating blankets are contemplated by the invention. The liquid supply 120 is preferably heated by a water jacket to minimize the amount of electrical equipment that might provide a source of ignition for flammable materials disposed in the liquid supply 120. Isolation valve 175 located near the introduction of the liquid supply 120 regulates flow from the liquid supply into fluid line 125 of the flow path 110.

The vaporization assembly 130 is connected to the liquid supply 120 by a fluid line 125 which form part of the flow path 110 of the precursor to the processing chamber 160. Fluid line 125 is a double contained line used for to receive the liquid precursor from the liquid supply 120. The fluid line 125 may be heated to a temperature to facilitate fluid flow therethrough, however, this is an optional procedure and may not be necessary for proper installation and operation of the liquid delivery system 100.

The vaporization assembly 130 includes the ampoule 140 and the mass flow controller 150, and is typically disposed remotely from the liquid supply 120, indicated by break 105, which is not achieved in prior art liquid delivery systems. The ampoule 140 is in fluid communication with the liquid supply 120 via the fluid line 125. The ampoule 140 includes an inlet for receiving fluid material from the liquid source 120 and an outlet for transporting materials to the mass flow controller 150 and subsequently the processing chamber 160. The outlet is preferably disposed in the top portion of the ampoule 140 to minimize liquid flow into fluid line 145. The ampoule 140 is a float type ampoule, but may comprise other types of ampoules commercially available, such as a capacitance-sense type ampoule. The ampoule 140 typically has a volume of about two liters or less. However, the invention contemplates ampoules having volumes of less than or greater than about 2 liters, depending upon the requirements of the liquid delivery system 100, the composition of the liquid precursor, and processes performed in processing chamber 160.

The ampoule 140 is operated at about ambient temperature, typically between 20° C. and about 25° C. to vaporize liquid precursors, but may be operated at higher or lower temperatures as desired. Heating elements, such as water jackets or heating blankets, may be disposed on or adjacent to the ampoule 140 to heat or cool the ampoule 140 to provide for operation of the ampoule 140 at a desired temperature. The ampoule 140 is isolated from the liquid supply 120 and mass flow controller 150 by isolation valves 175 and 180. Isolation valve 175 located between the liquid supply 120 and the ampoule 140 can be closed when the liquid supply 120 is being changed or replenished. Isolation valve 180 is located between the ampoule 140 and mass flow controller 150 and can be closed in conjunction with isolation valve 175 for ampoule replacement or during purging of the lines of the liquid delivery system 110 to remove impurities and other contaminant materials.

The mass flow controller 150 is coupled to the ampoule 140 by fluid line 145 and coupled to the processing chamber 160 by fluid line 155. The mass flow controller 150 measures the flow rate of vaporizer precursor from the ampoule 140 to the processing chamber 160 and regulates the amount of material transferred between the processing chamber 160 and the ampoule 140. The mass flow controller 150 can be programmed to regulate the exact flow rate depending upon the amount of material produced by the ampoule 140 in relation to the rate of usage, if any, of the vaporized material in the processing chamber 160. The mass flow controller 150 can be a commercially available model, such as produce by Millipore, of Redmond, Calif.

Fluid line 145 is disposed between the mass flow controller 150 and ampoule 140 to allow flow of the vaporized precursor from the ampoule 140. Fluid line 145 is typically heated, such as by heating tape or by other means, above the condensation temperature and below the decomposition temperature of the vaporized precursor. The mass flow controller is isolated from the ampoule 140 and the processing chamber by isolation valves 185 and 190. Closure of valves 185 and 190 can allow removal and replacement of the mass flow controller 150 from the liquid delivery system 110 during periodic equipment replacement or maintenance while minimizing contamination of the ampoule 140, processing chamber 160, or other components of the system 100.

The vaporization assembly 130 is preferably disposed in a gas box disposed adjacent the processing chamber 160 to provide a short flow path 155 between the ampoule 140 and the processing chamber 160. The processing chamber 160 is in fluid communication with the mass flow controller 150 and ampoule 140 via processing lines 155 and 145 respectively. The fluid line 155 disposed between the processing chamber 160 and the mass flow control 150 may be heated as necessary, above the condensation temperature and below the decomposition temperature of the vaporized precursor. In such embodiments, the heating temperatures of fluid lines 145 and 155 will vary based upon the chemical thermal characteristics of the material being transported therethrough. It is contemplated that fluid lines 145 and 155 may be heated to a temperature between ambient and about 100° C. to facilitate flow of the precursor and minimize condensation and degradation of the precursor in the lines.

Typically, the length of lines 145 and 155 located between the processing chamber 160 and the ampoule 140 are about 5 feet or less in length. By vaporizing the liquid precursor at the point of use adjacent the processing chamber 160, the requirements for heating and providing for safety features in lines transferring vaporized precursors are minimized. However, it is contemplated that the length of lines 145 and 155 located between the processing chamber 160 and the ampoule 140 may vary according to the processes performed utilizing the invention described herein and upon the configuration of the chamber and adjacent components, and the location of the liquid supply.

Figure 3:
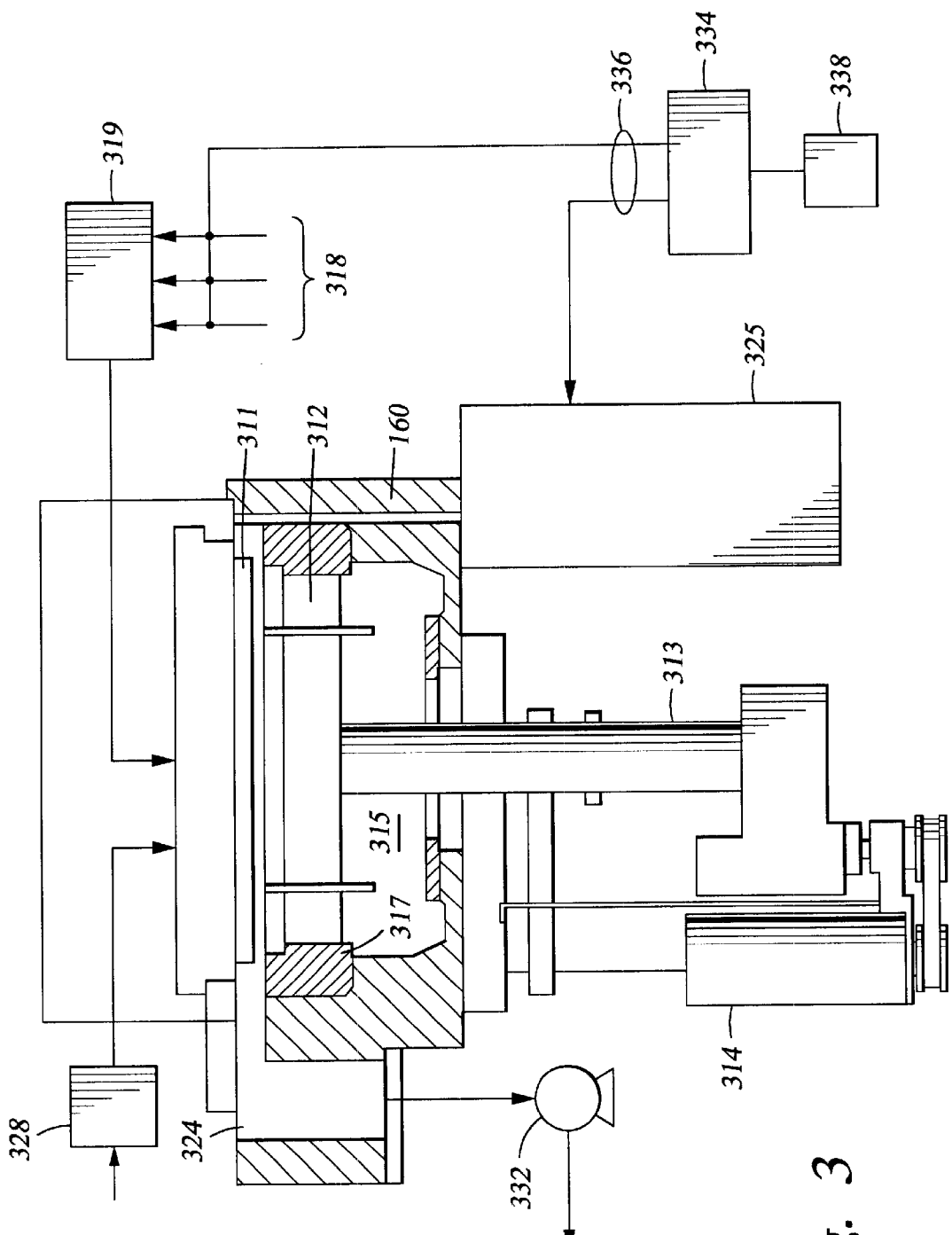
FIG. 3 is a schematic cross-sectional view of a chemical vapor deposition chamber suitable for plasma enhanced deposition of a film.

FIG. 3 is a schematic cross-sectional view of a chemical vapor deposition chamber for use with the invention described herein. The following CVD chamber description is illustrative and should not be interpreted or construed as limiting the scope of the invention.

The processing chamber 160 contains a gas distribution manifold 311 for dispersing process gases through perforated holes in the manifold to a substrate or substrate (not shown) that rests on a substrate support plate or susceptor 312 which is raised or lowered by a lift motor 314. A high vacuum region 315 is formed between the gas distribution manifold 311 and the susceptor 312. The processing chamber 160 includes heating of the process gases and substrate, such as by resistive heating coils (not shown) or external lamps (not shown).

Susceptor 312 is mounted on a support stem 313 so that susceptor 312 (and the substrate supported on the upper surface of susceptor 312) can be controllably moved between a lower loading/off-loading position and an upper processing position which is closely adjacent to manifold 311. During processing, gases inlet to manifold 311 are uniformly distributed radially across the surface of the substrate. A vacuum pump 332 having a throttle valve controls the exhaust rate of gases from the chamber.

Deposition gases, such as vaporized precursors, and carrier gases are inputted through gas lines 318 and mixing system 319 where the gases are combined and then sent to manifold 311. Generally, the process gases supply line 318 for each of the process gases also includes (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in processing chamber 160 can be either a thermal process or a plasma enhanced process. In a plasma process, a controlled plasma is typically formed adjacent to the substrate by RF energy applied to distribution manifold 311 from RF power supply 325 (with susceptor 312 grounded). Alternatively, RF power can be provided to the susceptor 312 or RF power can be provided to different components at different frequencies. RF power supply 325 can supply either single or mixed frequency RF power to enhance the decomposition of reactive species introduced into the high vacuum region 315.

When additional dissociation of a processing gas, such as an oxidizing gas, is desired, an optional microwave chamber 328 can be used to input from between about 0 Watts and about 6000 A gas distribution plate having separate passages for the precursor and the oxidizing gas is preferred when microwave power is added to the oxidizing gas.

Typically, any or all of the chamber lining, distribution manifold 311, susceptor 312, and various other reactor hardware is made out of material such as aluminum or anodized aluminum. An example of such a CVD reactor is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The lift motor 314 raises and lowers susceptor 312 between a processing position and a lower, substrate-loading position. The motor, the gas mixing system 319, and the RF power supply 325 are controlled by a system controller 334 over control lines 336. The reactor includes analog assemblies, such as mass flow controllers (MFCs) and standard or pulsed RF generators, that are controlled by the system controller 334 which executes system control software stored in a memory 338, which in the preferred embodiment is a hard disk drive. Motors and optical sensors are used to move and determine the position of movable mechanical assemblies such as the throttle valve of the vacuum pump 332 and motor for positioning the susceptor 312.

The system controller 334 controls all of the activities of the CVD reactor and a preferred embodiment of the controller 334 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus. The system controller 334 operates under the control of a computer program stored on the hard disk drive 338. The computer program dictates the timing, mixture of gases, RF power levels, susceptor position, and other parameters of a particular process.

Referring to FIG. 2, a pump assembly (not shown) may be disposed on fluid line 155 between the mass flow controller 150 and processing chamber 160. The pump assembly allows removal of material from the flow path 110 during a purge cycle or prior to isolation of devices during system maintenance or component replacement. The isolation valve assembly 195 includes a three-way valve, or alternatively, can include a series of isolation valves disposed around a "T" junction at point 195 for allowing flow of material between the mass flow controller 150 and either the processing chamber 160 or the pump assembly. The series of isolation valves are disposed on the flow path 110 along fluid lines 115, 155, and 200 to control fluid flow.

Methods of the Apparatus

The above described apparatus may be used for vaporizing and delivering a liquid precursor to a processing chamber by a method including providing a liquid supply containing a liquid precursor, delivering a liquid supply to an ampoule, vaporizing a portion of the liquid precursor in the ampoule, and flowing vaporized precursor to the processing chamber. The method described herein advantageously uses an internal gas pressuring system to transfer the precursor material from the liquid supply 120 to the processing chamber 160.

The source of liquid precursor, or the liquid supply 120, is provided by a container of the liquid precursor, as described above, positioned in fluid communication with the processing chamber 160, and modified to flow precursor from the liquid supply 120 to the flow path 110 via fluid line 125.

Delivery of the liquid precursor to the ampoule 140 is achieved by heating the liquid supply to vaporize a portion of the liquid precursor, such as trimethylsilane, contained therein. The vaporized precursor pressurizes the liquid supply, which forces the liquid into the fluid line 125 disposed in the liquid supply 120 to the ampoule 140. Typically, the fluid line 125 end is located near the bottom of the liquid supply 120 to effect transfer of the liquid precursor while maintaining the presence and pressure of the vaporized precursor.

The liquid supply is generally heated to a temperature between about 30° C. and about 40° C. The pressure of the vaporized precursor in liquid supply 120 is between about 15 psi and about 25 psi at such temperature for suitable precursors. Suitable liquid precursors include precursors having vapor pressures of about 1000 Torr or greater at about ambient temperature, i.e. between about 20° C. and about 25° C., are preferably used with the liquid delivery system 10 described herein. For example, a liquid supply of trimethylsilane, which has a vapor pressure of about 1200 Torr at ambient temperature has been observed to produce a chamber pressure between about 17 psi and about 19 psi when heated to a temperature between about 30° C. and about 33° C.

Fluid is then transferred from the liquid supply 120 to the ampoule 140 at a flow rate of between about 65 sccm and about 3000 sccm, and may vary on the vaporization rate of the ampoule and transfer rate to the processing chamber 160.

The ampoule 140 is preferably maintained at about ambient temperature, i.e. between about 20° C. and about 25° C., to vaporize the liquid precursors for delivery to the processing chamber 160. The vaporized precursor can be flowed to the processing chamber from the ampoule at a flow rate of between about 65 sccm and about 3000 sccm, and may vary on the vaporization rate of the ampoule and transfer rate to the processing chamber 160. Operating under ambient conditions, the ampoule 140 normally does not require heating, but may be heated as necessary depending upon the material used and the processes in which the material may be used. Generally, the ampoule is maintained at a lower temperature than the liquid supply 120, to provide a lower operating pressure than the liquid supply 120.

The pressure of the vaporized precursor in the ampoule is between about 1 psi and about 10 psi, preferably with a pressure of about 8 or 9 psi for a process utilizing trimethylsilane. Vaporizing a liquid precursor at ambient conditions in the ampoule eliminates the requirement for traditional vaporizer components, such as an injection valve, thereby reducing mechanical complexity of the system and removing a potential source of contamination from the system.

The lower operating pressure of the ampoule 140 provides a pressure differential between the liquid supply 120 and the ampoule 140 to enhanced fluid flow from the liquid supply 120 to the ampoule 140. For example, trimethylsilane has been observed to produce an ampoule pressure of about 9 psi when heated to a temperature between about 20° C. and about 25° C. compared to the liquid supply pressure of about 17 psi produced at a temperature between about 20° C. and about 25° C. The pressure differential, for example 8 psi, improves the flow of liquid precursor to the ampoule. The transfer of material by a pressure differential minimizes or eliminates the need for supplying a carrier gas or pressurizing gas to transfer material from the liquid supply 120 to the ampoule 140 and further limits the mechanical complexity of the system.

In an alternative embodiment, an inert gas may be introduced into the liquid supply to increase the pressure differential to improve transfer of liquid precursor from the liquid source 120 to the ampoule 140. The volume of the ampoule 140 is preferably less than about 2 liters to prevent any unnecessary condensation of the vaporized precursor prior to delivery to the processing chamber. The volume of the liquid precursor within the ampoule 140 is preferably about 1 liter or less inside the 2 liter ampoule.

Vaporized precursor is delivered to the processing chamber 160 by application of a pressure differential between the processing chamber 160 and the ampoule 140. The processing chamber 160 is typically operated and maintained at a pressure less than the pressure of the ampoule 140 to provide flow from the ampoule 140 to the processing chamber 160. The processing chamber 160 is preferably maintained at a chamber pressure of about 200 Torr or less. A chamber pressure of about 20 Torr or less allows the application of a vacuum to be effected on the ampoule 140 and draw vaporized precursor from the ampoule 140 to the processing chamber 160. The vaporized precursor flows to the processing chamber from the ampoule at a flow rate between about 65 sccm and about 3000 sccm. The mass flow controller 150 disposed between the ampoule 140 and processing chamber 160 measures and regulates the flow of the vaporized precursor to the processing chamber.

The flow of the precursor through the liquid delivery system 100 can be described as follows. A liquid supply 120 of liquid precursor is provided and heated to a temperature above the vaporization temperature of the material. The pressurized liquid precursor flows from the liquid supply 120 through valve 170 into fluid line 125 of the flow path 110, and through valve 175 into the ampoule 140 disposed in the vaporization assembly 130. Isolation valves 180, 185, 190, and 195 are opened to allow the processing chamber 160 operating at a chamber pressure of about 1 Torr to pull a vacuum on the ampoule 140.

Vaporized precursor flows from the ampoule 140 through valve 180 into fluid line 145 to the mass flow controller 150 via valve 185. The fluid flow to the processing chamber 160 is regulated by the mass flow controller as necessary, and then flows from the mass flow controller 150 through isolation valve 190 into fluid line 155, and through valve 195 into fluid line 115 for introduction into the processing chamber 160. When delivery of vaporized precursor to the processing chamber 160 is not desired, isolation valves 190 and 195 may be closed to prevent fluid flow from the ampoule by the pressure differential between the processing chamber 160 and ampoule 140. Additionally, vaporized precursor may be removed from the system by configuring valve 195 to transfer vaporized precursor vacuum to the pump assembly for disposal.

While foregoing is directed to the preferred embodiment of the present invention, other and further embodiments of the invention may be devised without departing from the basic scope thereof, and the scope thereof is determined by the claims that follow.

What is claimed is:

1. A method for vaporizing a liquid precursor for delivery to a processing chamber, comprising:
   providing a liquid supply containing a liquid precursor and an ampoule coupled to the liquid supply;
   delivering the liquid precursor to the ampoule, wherein delivering the liquid precursor to the ampoule comprises pressurizing the liquid supply by a thermal process to a first pressure higher than a second pressure in the ampoule and flowing the liquid precursor to the ampoule by a first pressure differential;
   vaporizing a portion of the liquid precursor in the ampoule; and
   flowing vaporized precursor to a processing chamber coupled to the ampoule.

2. The method of claim 1, wherein the thermal process heats the liquid precursor to a temperature above a vaporization temperature of the liquid precursor.

3. The method of claim 1, wherein the first pressure is between about 15 psi and about 25 psi.

4. The method of claim 1, wherein the first pressure differential delivers the liquid precursor to the ampoule at a flow rate between about 65 sccm and about 3000 sccm.

5. The method of claim 1, wherein the liquid precursor has a vapor pressure of about 1000 Torr or greater at a temperature between about 20° C. and about 25° C.

6. The method of claim 1, wherein the thermal process comprises heating the liquid supply to a temperature of between about 30° C. and about 40° C.

7. The method of claim 1, wherein vaporizing a portion of the liquid precursor in the ampoule comprises maintaining the ampoule at a temperature between about 20° C. and about 25° C.

8. The method of claim 2, wherein the second pressure is between about 1 psi and about 10 psi.

9. The method of claim 1, wherein the vaporized precursor flows at a rate between about 65 sccm and about 3000 sccm to the processing chamber.

10. The method of claim 3, wherein the processing chamber has a third pressure less than the second pressure in the ampoule and vaporized precursor is delivered to the processing chamber by a second pressure differential.

11. The method of claim 10, wherein the processing chamber has a chamber pressure about 200 Torr or less.

12. The method of claim 1, wherein the liquid precursor comprises an organic material.

13. A method for vaporizing a liquid precursor for delivery to a processing chamber, comprising:
    providing a liquid supply containing a liquid precursor and an ampoule coupled to the liquid supply;
    heating the liquid supply to a first temperature above a vaporization temperature of the liquid precursor to provide a first pressure in the liquid supply;
    operating the ampoule at a second pressure lower than the first pressure and at a second temperature less than the first temperature;
    flowing the liquid precursor from the liquid supply to the ampoule by a first pressure differential between the first pressure and the second pressure;
    vaporizing a portion of the liquid precursor in the ampoule;
    operating a processing chamber coupled to the ampoule at a third pressure lower than the second pressure; and
    flowing vaporized precursor from the ampoule to the processing chamber by a second pressure differential between the second pressure and the third pressure.

14. The method of claim 13, wherein the first pressure is between about 15 psi and about 25 psi.

15. The method of claim 13, wherein the liquid precursor flows to the ampoule at a flow rate between about 65 sccm and about 3000 sccm.

16. The method of claim 13, wherein the liquid precursor has a vapor pressure of about 1000 Torr or greater at a temperature between about 20° C. and about 25° C.

17. The method of claim 13, wherein the first temperature is between about 30° C. and about 40° C.

18. The method of claim 13, wherein the vaporizing a portion of the liquid precursor in the ampoule comprises maintaining the ampoule at a second temperature between about 20° C. and about 25° C.

19. The method of claim 13, wherein the second pressure is between about 1 psi and about 10 psi.

20. The method of claim 13, wherein the vaporized precursor flows at a rate between about 65 sccm and about 3000 sccm to the processing chamber.

21. The method of claim 13, wherein the processing chamber has a third pressure of about 200 Torr or less.

22. The method of claim 21, wherein the processing chamber has a chamber pressure of less than about 20 Torr.

23. The method of claim 13, wherein the liquid precursor comprises an organic material.

24. A method for vaporizing a liquid precursor for delivery to a processing chamber, comprising
    providing a liquid supply containing a liquid precursor and an ampoule coupled to the liquid supply;
    heating the liquid supply to a first temperature above a vaporization temperature of the liquid precursor to provide a first pressure between about 15 psi and about 25 psi in the liquid supply;

flowing the liquid precursor from the liquid supply to the ampoule by maintaining the ampoule at a second pressure between about 1 psi and about 10 psi;

vaporizing a portion of the liquid precursor in the ampoule by operating the ampoule at a second temperature above a vaporization temperature of the liquid precursor; and flowing vaporized precursor to a processing chamber coupled to the ampoule.

25. The method of claim 24, wherein the liquid precursor has a vapor pressure of about 1000 Torr or greater at a temperature between about 20° C. and about 25° C.

26. The method of claim 24, wherein the first temperature is between about 30° C. and about 40° C.

27. The method of claim 24, wherein the second temperature is between about 20° C. and about 25° C.

28. The method of claim 24, wherein the processing chamber has a pressure of about 200 Torr or less.

29. The method of claim 24, wherein the liquid precursor comprises an organic material.

* * * * *

UNITED STATES PATENT AND TRADEMARK OFFICE
CERTIFICATE OF CORRECTION

PATENT NO. : 6,443,435 B1
DATED : September 3, 2002
INVENTOR(S) : Hendrickson

It is certified that error appears in the above-identified patent and that said Letters Patent is hereby corrected as shown below:

<u>Column 4,</u>
Line 8, please change "con the" to -- contained therein, and the --.

Signed and Sealed this

Twenty-sixth Day of August, 2003

JAMES E. ROGAN
*Director of the United States Patent and Trademark Office*